(12) United States Patent
Kou (10) Patent No.: US 8,269,973 B2
(45) Date of Patent: Sep. 18, 2012

(54) DETECTING COMPONENT CARRIER TAPE SPLICING

(75) Inventor: Yuen-Foo Michael Kou, Andover, MA (US)

(73) Assignee: Accu-Assembly Incorporated, Andover, MA (US)

( * ) Notice: Subject to any disclaimer, the term of this patent is extended or adjusted under 35 U.S.C. 154(b) by 493 days.

(21) Appl. No.: 12/465,131

(22) Filed: May 13, 2009

(65) Prior Publication Data

US 2010/0290885 A1    Nov. 18, 2010

(51) Int. Cl.
*G01N 21/55* (2006.01)
(52) U.S. Cl. ........................................ 356/445
(58) Field of Classification Search ............... 356/445, 356/429, 430, 431
See application file for complete search history.

(56) References Cited

U.S. PATENT DOCUMENTS

| | | |
|---|---|---|
| 3,967,994 A | 7/1976 | Langberg |
| 4,331,985 A | 5/1982 | Tanaka |
| 4,583,669 A | 4/1986 | Sirkis |
| 4,610,083 A | 9/1986 | Campisi et al. |
| 4,653,664 A | 3/1987 | Hineno et al. |
| 4,742,406 A | 5/1988 | Turuda |
| 4,756,012 A | 7/1988 | French |
| 5,191,693 A | 3/1993 | Umetsu |
| 5,289,625 A | 3/1994 | Umetsu et al. |
| 5,342,460 A | 8/1994 | Hidese |
| 5,472,153 A | 12/1995 | Crowley et al. |
| 5,515,600 A | 5/1996 | Iwasaki et al. |
| 5,553,376 A | 9/1996 | Solanki et al. |
| 5,713,125 A | 2/1998 | Watanabe et al. |
| 5,775,945 A | 7/1998 | Bianca et al. |
| 5,873,966 A | 2/1999 | Goldberg et al. |
| 5,938,890 A | 8/1999 | Schlinkmann et al. |
| 5,976,250 A | 11/1999 | Maetani et al. |
| 6,027,019 A | 2/2000 | Kou |
| 6,097,427 A | 8/2000 | Dey et al. |
| 6,141,869 A | 11/2000 | Crane et al. |

(Continued)

FOREIGN PATENT DOCUMENTS

EP    335582 B1    9/1993

(Continued)

OTHER PUBLICATIONS

International Search Report and Written Opinion of the International Search Authority in Application No. PCT/US2010/034590 dated Dec. 6, 2010, 11 pages.
International Preliminary Report on Patentability for Application No. PCT/US2010/034590, dated Nov. 24, 2011, 7 pages.

*Primary Examiner* — Roy M Punnoose
(74) *Attorney, Agent, or Firm* — Fish & Richardson P.C.

(57) ABSTRACT

In one aspect, detecting a splice connection along a component carrier tape extending from a component carrier tape feeder in a feeder slot on a pick-and-place machine having a pickup head is accomplished by scanning a section of a component carrier tape with a sensor, the sensor attached to the pick-and-place machine and positioned above or below a path of the component carrier tape, and detecting a splice connection with the sensor, the sensor generating a signal in response to detecting the splice connection such that the detection of the splice connection indicates the component carrier tape splice and such that the sensor is mounted such that relative position of the sensor with respect to the component carrier tape path is not affected by removal of the component carrier tape feeder slot or movement of the pickup head.

38 Claims, 4 Drawing Sheets

U.S. PATENT DOCUMENTS

| | | | |
|---|---|---|---|
| 6,157,870 A * | 12/2000 | Gfeller et al. | 700/231 |
| 6,324,752 B1 | 12/2001 | Wesseling et al. | |
| 6,530,517 B1 | 3/2003 | Kou | |
| 6,675,056 B1 | 1/2004 | Black et al. | |
| 6,694,606 B1 | 2/2004 | Ohashi et al. | |
| 6,817,216 B2 * | 11/2004 | Kou | 70/225 |
| 7,083,082 B2 * | 8/2006 | Byskov et al. | 235/375 |
| 2002/0143423 A1 * | 10/2002 | Huber et al. | 700/121 |
| 2004/0039480 A1 * | 2/2004 | Kou | 700/222 |
| 2004/0175257 A1 * | 9/2004 | Pallas | 414/222.02 |
| 2008/0147232 A1 * | 6/2008 | Kuribayashi et al. | 700/160 |

FOREIGN PATENT DOCUMENTS

| | | |
|---|---|---|
| JP | 1990135800 A | 5/1990 |
| JP | 1991008655 A | 1/1991 |
| JP | 1991133763 A | 6/1991 |
| JP | 1993145283 A | 6/1993 |
| JP | 2000013092 A | 1/2000 |
| JP | 2007109780 A | 4/2007 |

* cited by examiner

DETECTING COMPONENT CARRIER TAPE SPLICING

TECHNICAL FIELD

This invention relates to detecting splice connections on component carrier tapes, such as on electrical component pick-and-place machines.

BACKGROUND

Circuit boards and other modules are often assembled with pick-and-place machines containing multiple tape feeders each having components mounted to component carrier tapes wound around a reel. The component carrier tape unwinds as the pick-and-place machine uses components and empties the tape. New tapes may be spliced onto the tape before it is emptied. This avoids removing the feeder from the machine to load a new reel of components to the feeder that is running out of components.

This splicing operation suffers from the problem that a wrong reel (i.e., a reel with a wrong part number) can easily be spliced onto the existing reel. Often, bar code scanning of the new reel part number will prevent mistakes, but there is no guarantee that the machine operator will follow the instructions and correctly scan every new component reel when splicing.

One solution is to detect a splice with a splicing sensor. The component carrier tape is typically spliced with a small metallic strip, such as a copper strip, to reinforce the tape so that it will not jam in the feeder. Some existing systems include intelligent feeders which have an inductive sensor at the front of the feeder and wiring connecting the sensor to the machine. The inductive sensors detect the metallic strip and alert the machine of the component carrier tape splice. Metallic strips can also be detected using electrodes positioned on the feeder. As the metallic strip slides pass the electrodes, the metal strip comes into contact with the electrodes creating a closed loop circuit to indicate the presence of a splice. Other systems have an optical sensor attached to the feeder and positioned at the sprocket hole position of the component carrier tape. The sensor is adapted to measure the transmission of light through the sprocket holes of the component carrier tape. The splice is created using an adhesive splicing tape such that the width of the tape used on top side of the component carrier tape is wider than the splicing tape on the bottom side of the component carrier tape. The wider adhesive tape covers the sprocket holes in the component carrier tape and prevents the transmission of light through the holes. The regular width adhesive tape on the bottom of the component carrier tape leaves the sprocket holes exposed allowing the component carrier tape to be advanced by the sprocket on the feeder. The adhesive tape used on the top side of the component carrier tape is sufficiently thick so as not to allow any light to pass through the sprocket hole. Thus, a splice is detected when the optical sensor fails to detect the expected light signal through the sprocket hole.

Intelligent feeders are widely available and are typically more expensive than their 'non-intelligent' counterparts. Retrofitting an existing 'non-intelligent' system with an inductive sensor system can be difficult due to the extensive modifications that are typically required, and very costly. For example, a 100-feeder-slot machine will typically have about 200 feeders to support the piece of equipment.

An alternative solution is found in my U.S. Pat. No. 6,817,216, the entire contents of which are hereby incorporated by reference for all purposes. The system in U.S. Pat. No. 6,817,216 includes an example employing a color sensitive optical sensor disposed on the machine's pickup head. In this case, the optical sensor is used to detect a color associated with the splice connection. This scheme avoids the need for intelligent feeders or modifications to multiple feeders, and only requires modification to the machine pickup head. However, because the pickup head frequently moves at high speeds, operators and pick-and-place machine providers prefer to avoid this type of modification as it will affect the operating dynamic of the pickup head.

What is needed, therefore, are better splicing and splice detection methods that allow for un-interrupted operation of pick-and-place machines while providing reliable operation. Also needed are systems that allow retrofitting of pick-and-place machines and their control systems to have splice detection capability, without extensive modifications to the tape feeders or the machines.

SUMMARY

In one aspect, detecting a splice connection along a component carrier tape extending from a component carrier tape feeder in a feeder slot on a pick-and-place machine having a pickup head is accomplished by scanning a section of a component carrier tape with a sensor, the sensor attached to the pick-and-place machine and positioned above or below a path of the component carrier tape, and detecting a splice connection with the sensor, the sensor generating a signal in response to detecting the splice connection such that the detection of the splice connection indicates the component carrier tape splice and such that the sensor is mounted such that relative position of the sensor with respect to the component carrier tape path is not affected by removal of the component carrier tape feeder from the feeder slot or movement of the pickup head.

In some cases, this is accomplished by further transmitting the signal along a link between the sensor and a controller, and responsive to receiving the signal, the controller identifying the feeder slot associated with the sensor that detected the splice connection and alerting an operator. In some examples, identifying the feeder slot associated with the sensor detecting the splice connection is based on a one-to-one association between the sensor and the feeder slot. In some implementations, the signal includes a feeder slot identifier corresponding to the feeder slot in which the splice connection was detected. In some cases, scanning a section of the component carrier tape with a sensor is accomplished by emitting a light on to the component carrier tape, and measuring a reflection of the light.

In some examples, the sensor is a vision camera connected to a processor programmed to detect a color associated with the splice connection. The processor, in some examples, is programmed to identify the feeder slot in which the splice connection is detected. In some examples, the sensor is a vision camera connected to a processor of the controller and the processor is coupled to a memory storing instructions executable by the processor to detect a color associated with the splice connection and to identify the feeder slot in which the splice connection is detected. In some cases, the color is a fluorescent enhanced color. In other examples, the sensor is a color sensor and, in some cases, the color sensor includes an optical lens.

In another aspect, retrofitting a pick-and-place machine with a splice detection system is accomplished by attaching a splice detection sensor to the pick-and-place machine above or below a component carrier tape path, linking the sensor to a controller, and configuring the controller to respond to a signal transmitted by the sensor in response to detecting a splice connection. The sensor is attached to the machine such that movement of a pickup head of the pick-and-place machine and replacement of a feeder from which the component carrier tape extends does not affect the position of the sensor with respect to the component carrier tape path, and such that responsive to the transmitted signal, the controller identifies a location corresponding to a feeder slot associated with the sensor.

In some examples, the sensor is a color sensor and includes an optical lens. In other examples, the sensor is a vision camera connected to a processor, the processor programmed to detect a color associated with the splice connection. In some implementations, the processor is programmed to identify the feeder slot in which the splice connection is detected. In some implementations, the processor is a central processor unit of the controller and includes executable instructions to effect the detection of the splice connection and the transmission of the signal, and wherein the response of the controller to the signal transmitted by the sensor includes alerting an operator. In some cases, the color is a fluorescent enhanced color.

In some implementations, retrofitting a pick-and-place machine with a splice detection system is accomplished by further associating the sensor with a corresponding feeder slot. In some examples, the association is one-to-one and/or the location is a feeder slot number. Further, in some examples, the signal includes an identifier associated with the feeder slot number.

In another aspect, a pick-and-place machine includes a pickup head moveable to pick electrical components from component carrier tapes extending from feeders mounted in respective feeder slots of the machine, and component tape splice sensors attached to the machine and positioned above or below respective tape paths. The sensors are each adapted to scan component carrier tape in their respective paths and to generate a splice detection signal in response to detecting a splice connection. The machine also includes a controller linked to the sensors and configured to receive the splice detection signals and to identify, in response to receiving a splice detection signal, a respective feeder slot associated with the detected splice connection. Further, the sensors are mounted such that relative positioning of each sensor with respect to its respective component carrier tape path is not affected by replacement of the associated feeder or movement of the pickup head.

In some implementations, the sensors include a vision camera connected to a processor programmed to detect a color associated with the splice connection. The processor, in some implementations, is programmed to determine the feeder slot in which the splice connection is detected. The processor, in some examples, is a central processor unit of the controller and includes executable instructions to effect the detection of the splice connection and the transmission of the splice detection signal. In some cases, the splice detection signal is a software encoded flag and/or a bit setting in a memory register of the processor. In some examples, the sensors include a vision camera connected to a processor of the controller, the processor coupled to a memory storing instructions executable by the processor to detect a color associated with the splice connection and to determine the feeder slot in which the splice connection is detected. In some implementations, the link is an internal data bus of the processor. In some examples, the sensors are color sensors and, in some cases, the color sensors include an optical lens. In some instances, the sensors are adapted to measure a reflection of a light emitted on to the component carrier tape. In some implementations, the sensors are associated with corresponding feeder slots. In some cases, the association is one-to-one. The splice detection signal, in some implementations, includes an identifier, including, for example, a feeder slot number, associated with the feeder slot in which the splice connection is detected.

The features and techniques disclosed herein may provide the added benefit of reduced manufacturing costs due to fewer reworks and more efficient use of equipment capacity. Furthermore, costs may be reduced by eliminating the use of the copper strip to connect the two component carrier tapes. Still further, as mentioned above, because installing a sensor on each feeder is not only costly, but complicated due to the wiring necessary to allow communication between the 'intelligent' feeder and the machine, the present features and techniques can provide an alternative to some such modifications and/or to replacement of some equipment.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
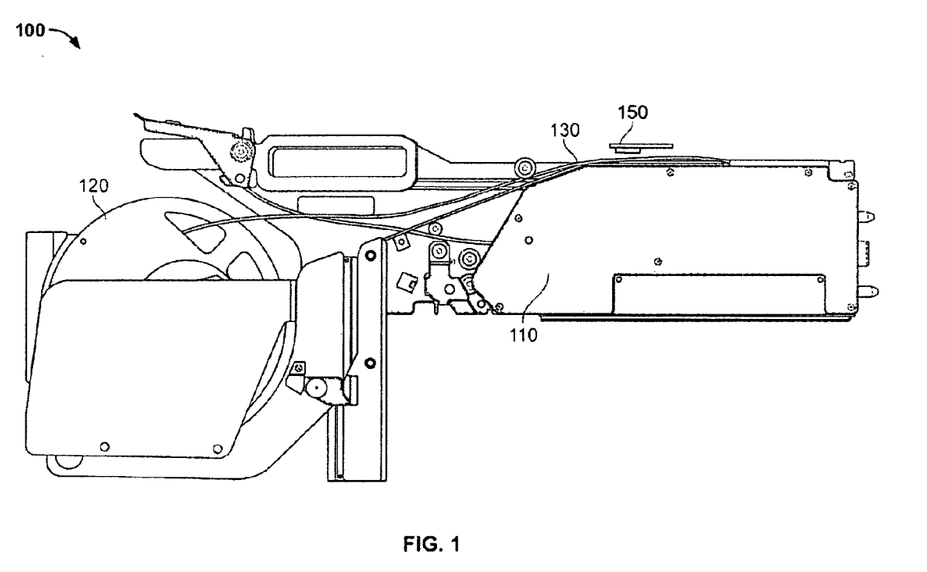
FIG. 1 is an illustration of a component carrier tape feeder.

FIG. 1 shows a view 100 of an exemplary part feeder 110. In general, part feeder 110 is used to hold a supply of parts for use by an automated pick-and-place machine, such as machines typically used for assembling surface-mount electronic assemblies. Feeder 110 includes a reel 120 and a tape 130. In some implementations, tape 130 holds a supply of electronic components (e.g., integrated circuits, resistors, capacitors, inductors) for use by the pick-and-place machine. Tape 130 is wound around reel 120, and the right-hand depicted end of feeder 110 is inserted into a slot on the pick-and-place machine, with the tape fed into a receiving assembly on the machine.

In operation, one or more feeders 110 are mounted in the pick-and-place machine to supply the machine with one or more electronic component types. As electronic components are consumed, tape 130 unwinds off reel 120. In preferred implementations, a technician using a system control computer monitors the number of electronic components that remain on tape 130. Eventually, the parts tape 130 will be substantially consumed. When the reel on the feeder is about to run out of parts, the operator splices new tape to the remaining tape, preferably operating from the back of the feeder (that is accessible from the exterior of the machine) while the machine is running. The operator removes the reel 120 and unreels the remaining tape on the reel, and then splices a new tape 130 of the same part number from the new reel 120 onto the end of the old tape. The operator rolls the tape back into a single reel and then put it back into the feeder 110. In this preferred implementation, because the feeder is never removed from the machine, the machine never has to stop. In some implementations, the pick-and-place machine may be stopped to allow a technician to replace the empty reel 120 with another reel 120 that has a new tape 130 wound upon it.

FIG. 1 also shows a splice detector 150 attached to the pick-and-place machine (not shown) above or below the path of the component carrier tape. In general, the splice detector 150 detects the splice between two electronic component tapes 130, 131. In some implementations, detection of the splice may allow the pick-and-place machine to automatically initiate operations to accommodate the start of the fresh tape (e.g., reset a count of the number of parts that remain on the tape). In some implementations, detection of the splice may allow technicians to verify manually that the new tape contains the correct type of electronic components.

Figure 2A:
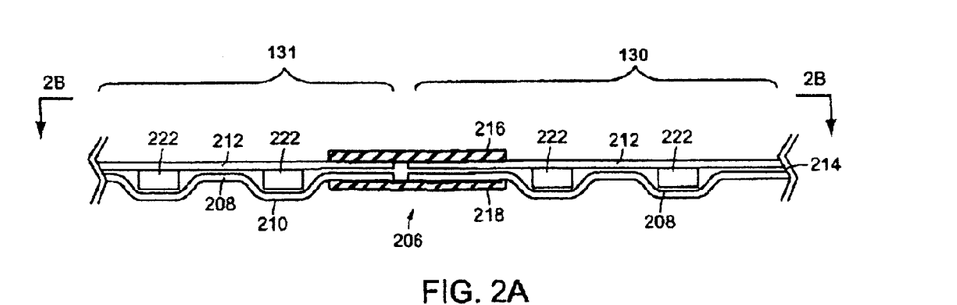
FIGS. 2A and 2B illustrate a cutaway elevation view of a component carrier tape and a plan view of the component carrier tape, respectively.
Figure 2B:
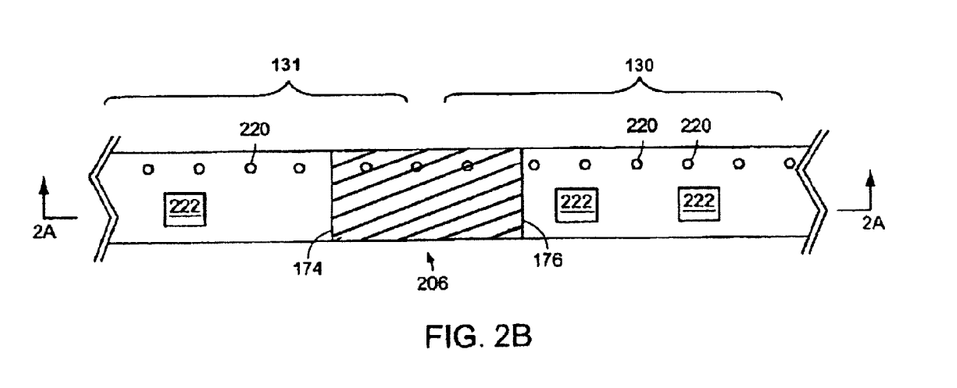

FIGS. 2A and 2B illustrate a component carrier tape 130 having a first length connected to a component carrier tape 131 having a second length by a splice connection 206. The component carrier tape includes a supply tape portion 208 having a plurality of pockets 210 positioned along the length of the carrier tape. Each pocket 210 can contain an electronic component 222 for subsequent positioning upon a destination circuit board. A removable cover tape portion 212 is secured to the supply tape portion 208 by an adhesive material 214 to cover each pocket 210.

The splice connection 206 typically includes an adhesive material such as adhesive tape and may have a particular characteristic that is detectable by splice detector 150. For example, the splice connection 206 may exhibit a particular color, reflectivity, and/or fluorescence. Preferably, the splice connection 206 includes splice material extending substantially around the perimeter of the component carrier tape at the splice location. However, as a minimum, the splice connection 206 should include at least a top portion 216 connecting the cover tape portion 212 of the first component carrier tape 130 to the cover tape portion 212 of the second component carrier tape 131 and a bottom portion 218 connecting the supply tape portion 208 of the first component carrier tape 130 to the supply tape portion 208 of the second component carrier tape 131. The supply tape portion 208 is typically either paper or a molded plastic and the cover tape portion 212 is typically a Mylar material, but other materials also may be suitable as well. A plurality of tape perforations 220 are positioned along the length of the component carrier tape 106 at approximately equal intervals for mating with a carrier tape drive unit.

Figure 3:
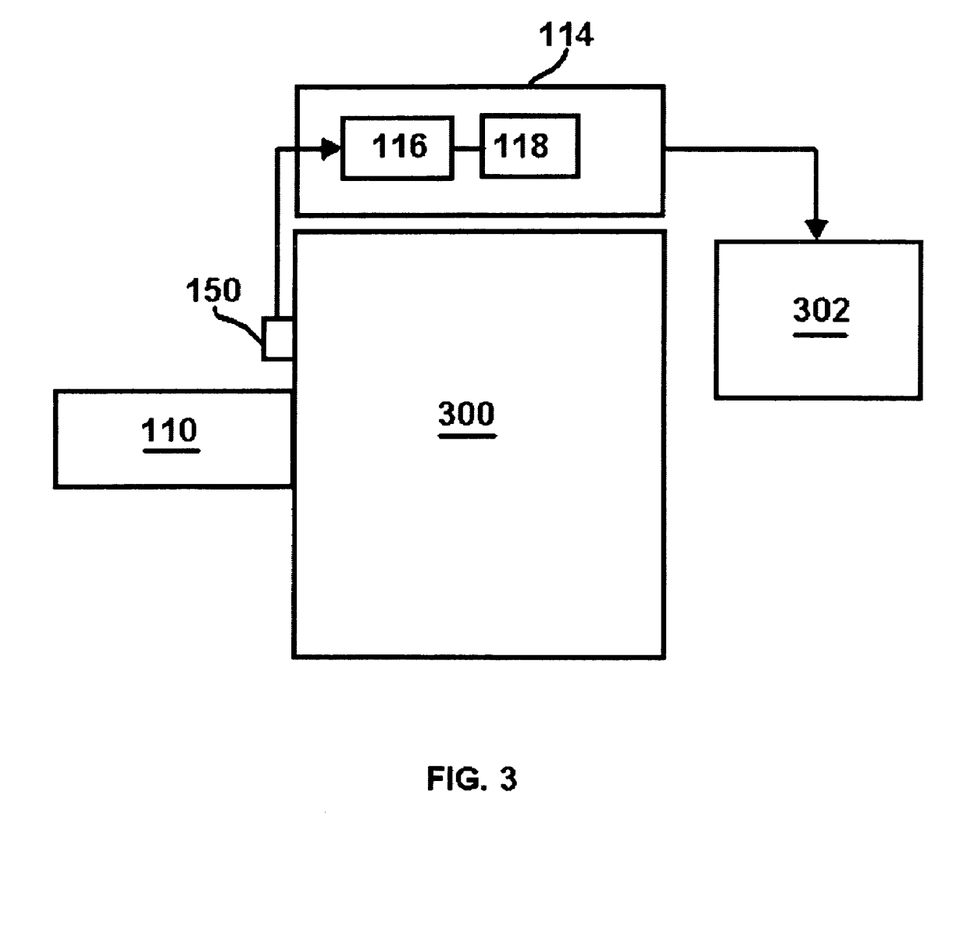
FIG. 3 is a system block diagram.

Referring now to the block diagram of FIG. 3, an electronic component feeder 110 is attached to a pick-and-place machine 300. In certain implementations, however, the controller 114 may be situated at a location that is remote from the pick-and-place machine 300. The splice detector 150 is linked to the controller 114, for example by a hardwired connection or a wireless communication link. Furthermore, the controller includes a memory storage unit 118 coupled to the processor 116. Processor 116 may be a general or special purpose processor including a central processor unit, a digital signal processor, etc.

Data entry device 302 is coupled to the controller 114. The data entry device 302 enables the entry of identification data associated with each component carrier tape and the components located thereon for storage in the memory storage unit 118. The data entry device also enables the entry of identification data associated with circuit boards that are processed by the pick-and-place machine. The data entry device 302 may be, for example, a keyboard, a hand-held scanner, or some other automated data entry apparatus. The identification data may be applied to a reel of components in the form of a barcode strip, such as, for example, a bar code label discussed in U.S. Pat. No. 6,027,019, which is hereby incorporated in its entirety by reference. If a bar code strip or label is affixed to a reel, the data entry unit 302 may be designed as a barcode reader.

When a first reel of component carrier tape, for example reel 120, is coupled to a feeder, for example feeder 110, identification data associated with reel 120 and the components mounted thereon may be entered via the data entry unit 302, into the memory storage unit 118. As the component carrier tape 130 is advanced, the components are transported to a pickup position where the pickup head can sequentially pickup the component, as required, for subsequent placement upon a destination circuit board.

As the pick-and-place machine 300 continues to operate, eventually, the number of available components on the first component carrier tape 130 may diminish significantly. If such a condition arises, the operator may decide to or be prompted to reload components at the associated feeder position. The operator may accomplish this by splicing a second component carrier tape 131, to the first component carrier tape 130 without shutting down the pick-and-place machine 300. To do this, the operator removes the first reel 120 of component carrier tape from the feeder 110. The operator then unwinds the remaining portion of the first component carrier tape 130 from the reel 120 to expose a trailing end 176. Next, the operator attaches a leading end 174 of the second component carrier tape 131 from the second reel 121 to the exposed trailing end 176 with a splice connection 206. Subsequently, the operator enters identification data associated with the second component carrier tape 131 from reel 121 via the data entry device 302 for storage in memory storage unit 118. The operator then couples the second reel 121 to the original feeder 110 that is mounted to the pick-and-place machine 300. This may all be beneficially accomplished without having to interrupt the ongoing placement process.

As the remaining portion of the first component carrier tape 130 and the attached component carrier tape 131 advance together through the machine 300, the pickup head sequentially removes components from each of the pockets 210 on the remaining portion of the first component carrier tape 130. As the tape advances, eventually, the splice detector 150 detects the splice connection 206.

The splice detector 150 includes a sensor attached to the pick-and-place machine above the path of the component carrier tape. In some implementations, the sensor may alternatively be positioned below the component carrier tape. The sensor scans a section of the component carrier tape 130 until it detects a splice connection 206. Upon detecting a splice connection 206, the sensor generates and transmits a splice detection signal to the controller 114 via a wired or wireless link indicating a component carrier tape splice.

After the splice connection 206 is detected, the controller 114 determines the number of removals remaining until the pickup head will reach a component 222 on the second component carrier tape 131. This may be necessary if, for example, the splice detector 150 is positioned to scan a portion of the first component carrier tape 130 that is located some distance away from the pickup position. The number of removals remaining may be a fixed number. However, that may not always be the case and determination might require consideration of a variety of factors including, for example, the distance between components 222 on the first component carrier tape 130 and/or the size of those components 222.

Existing pick-and-place machines 300 may be retrofitted with a splice detector 150 by attaching the sensor directly to the pick-and-place machine. In this way, the feeder 110 may be interchanged or replaced with other feeders 110 without the need for either feeder to include a separate sensor. In addition, by avoiding attachment of the sensor to the pickup head, the dynamic balance of the pickup head is not affected (e.g., movement of the pickup head is unencumbered by the sensor and the sensor position is independent of any movement of the pickup head). Attaching the splice detector 150 to the pick-and-place machine 300 avoids the cost and the need for modifying each of the supporting feeders and the need to receive approval for the 'add-on' equipment from pick-and-place machine suppliers.

In some implementations, the sensor is associated with one or more feeder slots of the pick-and-place machine. Thus, when a splice detection signal is generated by the sensor, the corresponding feeder slots can be identified for verification or inspection. For example, the controller may be configured to notify the operator of the detected component carrier splice and to identify the feeder slot upon receiving the splice detection signal from the sensor. Preferably, the splice detection signal includes an identifier associated with the feeder slot (e.g., a feeder slot number).

Detecting a splice connection 206 using the splice detector 150 secured to the pick-and-place machine can trigger and enable several functions. For example, if the splice detector 150 detects a splice connection 206 between a first component carrier tape 130 and a second component carrier tape 131, the identification data associated with each length of tape stored in the memory storage unit 118 may then be read out by the processor 116 and subsequently compared to each other. If agreement in the data is found in a predetermined manner, which provides assurance that the spliced second component carrier tape 131 is correct for the particular application, the data associated with the second component carrier tape 131 may be released for use by die pick-and-place machine 300 and processing of the second component carrier tape 131 may be allowed to proceed. If a lack of agreement is found, this lack of agreement may be signaled to the operator as a warning and further processing of the second component carrier tape 131 may be suspended. In this way, reloading correct components can be ensured without reducing production efficiency.

In another example, if the splice detector 150 detects a splice connection 206 between a first component carrier tape 130 and a second component carrier tape 131 while no identification data associated with the second component carrier tape 131 exists in the memory storage unit 118 (e.g., if the operator failed to enter the identification data via the data entry device 302), the lack of data may be signaled to the operator as a warning and further processing of the second component carrier tape 131 may be suspended.

The splice detector 150 can be implemented using commercially available components. For example, the splice detector 150 could include a color sensor. An optical lens can be used to enhance the reliability of the detector at certain distances above or below the scanned portion of the component carrier tape. Preferably, the splice detector 150 will be oriented to scan an area of the component carrier tape 130, for example, within approximately 10-15 millimeters. In scanning the component carrier tape, a light is emitted onto the tape (e.g., by using light emitting diodes) and the color sensor is used to measure the reflection of light (e.g., by using photodiodes). A light source may be selected to enhance a fluorescent property of the splice, e.g. a black light. In such a case, the splice detector 150 may be responsive to the fluorescence of the splice.

Figure 4A:
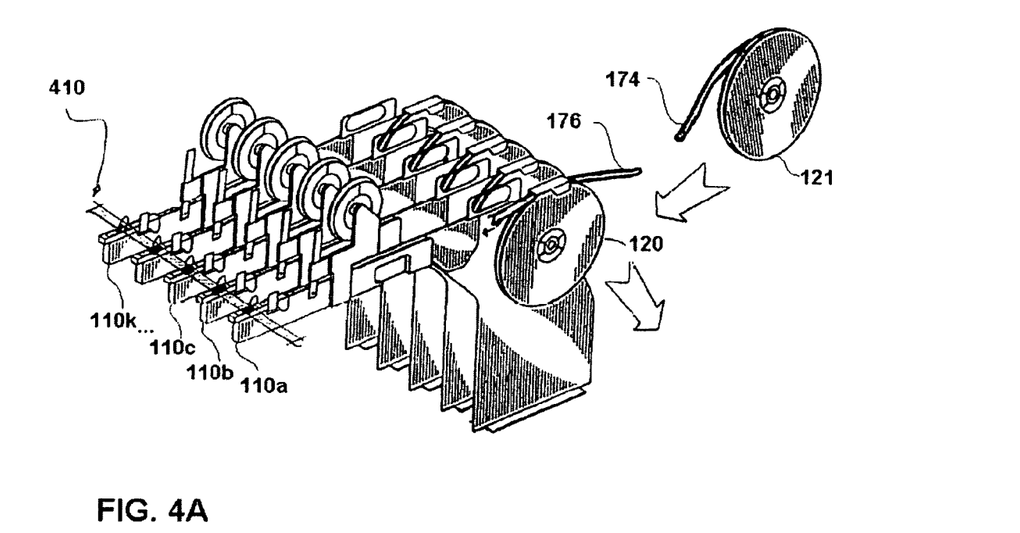
FIGS. 4A and 4B illustrate a pick-and-place machine with a splice detector.

The splice detector 150 is positioned above or below the path of the component carrier tape 130 so that any changes in the light reflected or splice fluorescence can be detected and a corresponding electronic signal can be generated and made available for further processing. As described above, the signal preferably includes an identifier associated with the feeder slot (e.g., a feeder slot number). In some implementations, the splice detector 150 is associated with a single feeder slot providing a one-to-one association as illustrated in FIG. 4A. In this example, the splice detector 150 is a color sensor. Multiple splice detectors 150 are attached to a bracket or a printed circuit board 410 and positioned above the component carrier tape paths of multiple electronic component feeders, each inserted in a respective feeder slot (not shown) of the pick-and-place machine. As such, each splice detector 150 monitors a single feeder. In such a case, the identifier associated with the feeder slot may be an identifier of the splice detector. In some cases, the identifier of the splice detector 150 is the physical location of the detector. Alternatively, the link between the sensor and the controller may be used to identify the splice detector, the location of the splice detector, and/or the corresponding feeder slot (e.g., a predetermined bit line on the data bus, or a time slot within the signal).

Figure 4B:
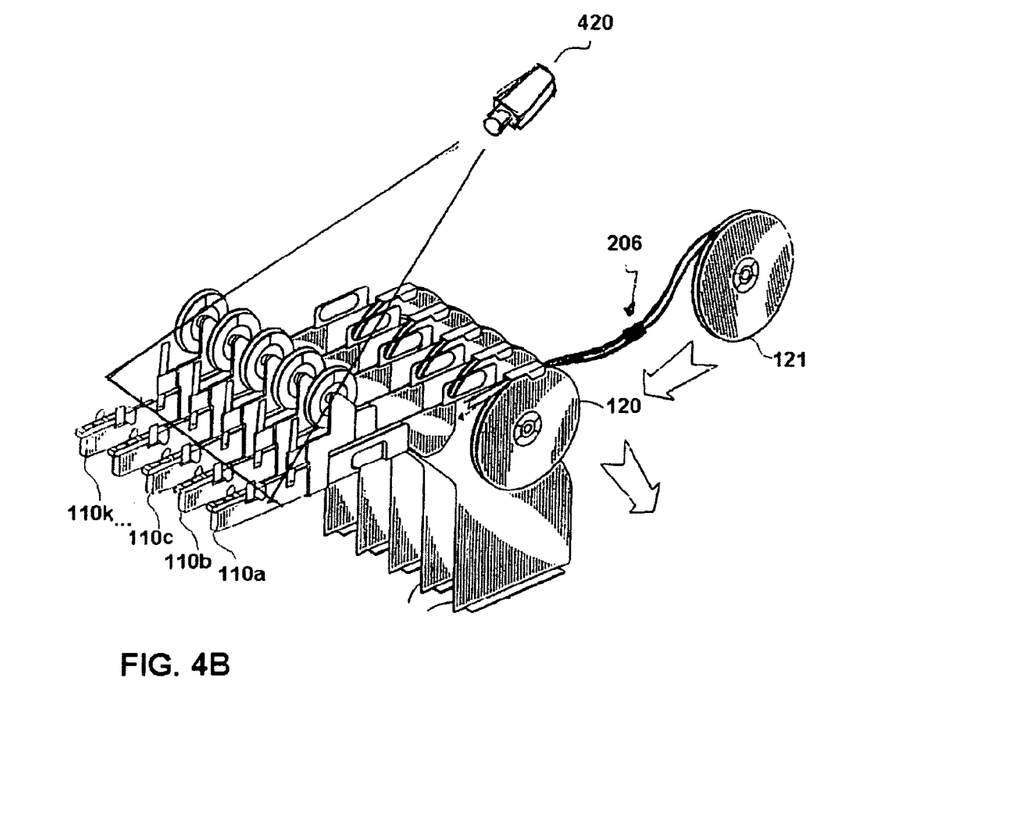

As shown in FIG. 4B, the splice detector 150 may include, or be in the form of, a vision camera. In this example, a vision camera 420 is securely fastened to the pick-and-place machine 300 (not shown). The vision camera 420 is arranged so that it will be functionally directed toward a selected region of the component carrier tape 130 of selected feeders (e.g., 110a, 110b, 110c, ..., and 110k). The vision camera 420, as shown, is oriented in such a manner that it can scan an area of the component carrier tape 130 that is upstream of the pickup position. The vision camera 420 can communicate with the controller 114 over a link, which may include, for example a hardwired connection or a wireless communication link.

The vision camera may be connected to a processor programmed to detect a color associated with the splice connection and/or to identify the feeder slot in which the splice connection is detected. For example, the vision camera 420 may include image capture and analysis software to be executed by the processor to detect the splice connection based on recognition of a color associated with the splice connection and to generate the splice detection signal. The processor could also be configured to identify the feeder slot in which a splice connection is detected. For example, software or firmware stored on a memory coupled to the processor includes instructions executable by the processor to detect a change in pixel color within spatial regions (e.g., a region defined by pixel coordinates) of a captured image or video. The spatial regions are associated with corresponding feeder slots such that multiple feeder slots can be monitored from a single vision camera. The association is preferably one-to-one so that a detection of a change in pixel color within one of the spatial regions enables the processor to determine the specific feeder slot in which the splice connection is detected. In a preferred implementation, software or firmware stored on a memory coupled to the processor includes instructions executable by the processor to detect a fluorescent color within spatial regions of a captured image or video. The spatial regions are associated with corresponding feeder slots such that each spatial region maps to a respective feeder slot (i.e., one-to-one associate) and such that a detection of the fluorescent color within one of the spatial regions enables the processor to determine the specific feeder slot in which the splice connection is detected. In some implementations, the identity of the feeder slot is included with the splice detection signal. In some implementations, the identity of the feeder slot is the splice detection signal. The splice detection signal could be implemented as a software encoded flag (e.g., by setting a monitored variable to a predetermined value, or calling a predetermined subroutine). The splice detection signal could also be implemented as a hardware flag, such as by setting a bit in a memory register of the processor.

The techniques described above could also be implemented in the processor 116 of the controller 114 using image capture and analysis software stored on the memory storage unit 118. In such an example, the link between the splice detector 420 and the controller 114 could be implemented as a described above, or using a data bus internal to the processor.

Many of the techniques described herein may be incorporated into an operating program for a pick-and-place machine that manages the operations of the pick-and-place machine. Various features of these techniques may be implemented with hardware, software or with a combination of hardware and software. For example, some aspects can be implemented in computer programs executing on programmable computers. Each program can be implemented in a high-level procedural or object-oriented programming language to communicate with a computer system. Furthermore, each of such computer programs can be stored on a storage medium, such as read-only-memory (ROM) readable by a general or special purpose programmable computer, for configuring and operating the computer and corresponding pick-and-place machine when the storage medium is read by the computer to perform the functions described above.

Although the above description and the attached claims disclose a number of examples, other alternative aspects are disclosed in the following further examples.

EXAMPLE 1

A method of detecting a splice connection along a component carrier tape extending from a component carrier tape feeder in a feeder slot on a pick-and-place machine having a pickup head, the method comprising: scanning a section of a component carrier tape with a sensor, attached to the pick-and-place machine and positioned above or below a path of the component carrier tape; and detecting a splice connection with the sensor, the sensor generating a signal in response to detecting the splice connection; wherein the detection of the splice connection indicates the component carrier tape splice; and wherein the sensor is mounted such that relative position of the sensor with respect to the component carrier tape path is not affected by removal of the component carrier tape feeder from the feeder slot or movement of the pickup head.

EXAMPLE 2

The method of example 1 further comprising: transmitting the signal along a link between the sensor and a controller; and responsive to receiving the signal, the controller identifying the feeder slot associated with the sensor that detected the splice connection and alerting an operator.

EXAMPLE 3

The method of example 2, wherein identifying the feeder slot associated with the sensor detecting the splice connection is based on a one-to-one association between the sensor and the feeder slot.

EXAMPLE 4

The method of example 2, wherein the signal includes a feeder slot identifier corresponding to the feeder slot in which the splice connection was detected.

EXAMPLE 5

The method of example 1, wherein the sensor is a vision camera connected to a processor, the processor programmed to detect a color associated with the splice connection.

EXAMPLE 6

The method of example 5, wherein the processor is programmed to identify the feeder slot in which the splice connection is detected.

EXAMPLE 7

The method of example 2, wherein the sensor is a vision camera connected to a processor of the controller, the processor coupled to a memory storing instructions executable by the processor to detect a color associated with the splice connection and to identify the feeder slot in which the splice connection is detected.

EXAMPLE 8

The method of example 7, wherein the color is a fluorescent enhanced color.

EXAMPLE 9

The method of example 1, wherein the sensor is a color sensor.

EXAMPLE 10

The method of example 9, wherein the color sensor includes an optical lens.

EXAMPLE 11

The method of example 1, wherein scanning a section of the component carrier tape with a sensor comprises: emitting a light on to the component carrier tape; and measuring a reflection of the light.

EXAMPLE 12

A method of retrofitting a pick-and-place machine with a splice detection system, the method comprising: attaching a splice detection sensor to the pick-and-place machine above or below a component carrier tape path; linking the sensor to a controller; and configuring the controller to respond to a signal transmitted by the sensor in response to detecting a splice connection; wherein the sensor is attached to the machine such that movement of a pickup head of the pick-and-place machine and replacement of a feeder from which the component carrier tape extends does not affect the position of the sensor with respect to the component carrier tape path; and wherein responsive to the transmitted signal, the controller identifies a location corresponding to a feeder slot associated with the sensor.

EXAMPLE 13a

The method of example 12, wherein the sensor is a color sensor.

EXAMPLE 13b

The method of example 12, wherein the sensor is a color sensor and includes an optical lens.

EXAMPLE 14

The method of example 12, wherein the sensor is a vision camera connected to a processor, the processor programmed to detect a color associated with the splice connection.

EXAMPLE 15

The method of example 14, wherein the color is a fluorescent enhanced color.

EXAMPLE 16

The method of example 14, wherein the processor is programmed to identify the feeder slot in which the splice connection is detected.

EXAMPLE 17

The method of example 14, wherein the processor is a central processor unit of the controller and includes executable instructions to effect the detection of the splice connection and the transmission of the signal, and wherein the response of the controller to the signal transmitted by the sensor includes alerting an operator.

EXAMPLE 18

The method of example 12, further comprising: associating the sensor with a corresponding feeder slot.

EXAMPLE 19

The method of example 18, wherein the association is one-to-one.

EXAMPLE 20

The method of example 12, wherein the location is a feeder slot number.

EXAMPLE 21

The method of example 20, wherein the signal includes an identifier associated with the feeder slot number.

EXAMPLE 22

A pick-and-place machine comprising: a pickup head moveable to pick electrical components from component carrier tapes extending from feeders mounted in respective feeder slots of the machine; component tape splice sensors attached to the machine and positioned above or below respective tape paths, the sensors each adapted to scan component carrier tape in their respective paths and to generate a splice detection signal in response to detecting a splice connection; and a controller linked to the sensors and configured to receive the splice detection signals and to identify, in response to receiving a splice detection signal, a respective feeder slot associated with the detected splice connection; wherein the sensors are mounted such that relative positioning of each sensor with respect to its respective component carrier tape path is not affected by replacement of the associated feeder or movement of the pickup head.

EXAMPLE 23a

The machine of example 22, wherein the sensors comprise a vision camera connected to a processor programmed to detect a color associated with the splice connection.

EXAMPLE 23b

The machine of example 22, wherein the sensors comprise a vision camera connected to a processor programmed to detect a color associated with the splice connection and to determine the feeder slot in which the splice connection is detected.

EXAMPLE 24

The machine of example 23, wherein the processor is programmed to determine the feeder slot in which the splice connection is detected.

EXAMPLE 25

The machine of example 23, wherein the processor is a central processor unit of the controller and includes executable instructions to effect the detection of the splice connection and the transmission of the splice detection signal.

EXAMPLE 26

The machine of example 25, wherein the splice detection signal is a software encoded flag.

EXAMPLE 27

The machine of example 25, wherein the splice detection signal is a bit setting in a memory register of the processor.

EXAMPLE 28

The machine of example 22 wherein the sensors comprise a vision camera connected to a processor of the controller, the processor coupled to a memory storing instructions executable by the processor to detect a color associated with the splice connection and to determine the feeder slot in which the splice connection is detected.

EXAMPLE 29

The machine of example 28, wherein the splice detection signal is a software encoded flag.

EXAMPLE 30

The machine of example 28, wherein the splice detection signal is a bit setting in a memory register of the processor.

EXAMPLE 31

The machine of example 30, wherein the link is an internal data bus of the processor.

EXAMPLE 32

The machine of example 22, wherein the sensors are color sensors.

EXAMPLE 33

The machine of example 32, wherein the color sensors include an optical lens.

EXAMPLE 34

The machine of example 32, wherein the sensors are adapted to measure a reflection of a light emitted on to the component carrier tape.

EXAMPLE 35

The machine of example 22, wherein the sensors are associated with corresponding feeder slots.

EXAMPLE 36

The machine of example 35, wherein the association is one-to-one.

EXAMPLE 37

The machine of example 35, wherein the splice detection signal includes an identifier associated with the feeder slot in which the splice connection is detected.

EXAMPLE 38

The machine of example 37, wherein the identifier is a feeder slot number.

A number of embodiments of the invention have been described. Nevertheless, it will be understood that various modifications may be made without departing from the spirit and scope of the invention.

What is claimed is:

1. A method of detecting a splice connection along a component carrier tape extending from a removable component carrier tape feeder in a feeder slot on a pick-and-place machine, the method comprising:
   scanning a section of a component carrier tape with a sensor attached to the pick-and-place machine and fixed above or below a path of the component carrier tape; and
   detecting a splice connection with the sensor, the sensor generating a signal in response to detecting the splice connection;
   wherein the detection of the splice connection indicates the component carrier tape splice.

2. The method of claim 1 further comprising:
   transmitting the signal along a link between the sensor and a controller; and
   responsive to receiving the signal, the controller identifying the feeder slot associated with the sensor that detected the splice connection and alerting an operator.

3. The method of claim 2, wherein identifying the feeder slot associated with the sensor detecting the splice connection is based on a one-to-one association between the sensor and the feeder slot.

4. The method of claim 2, wherein the signal includes a feeder slot identifier corresponding to the feeder slot in which the splice connection was detected.

5. The method of claim 1, wherein the sensor is a vision camera connected to a processor, the processor programmed to detect a color associated with the splice connection.

6. The method of claim 5, wherein the processor is programmed to identify the feeder slot in which the splice connection is detected.

7. The method of claim 2, wherein the sensor is a vision camera connected to a processor of the controller, the processor coupled to a memory storing instructions executable by the processor to detect a color associated with the splice connection and to identify the feeder slot in which the splice connection is detected.

8. The method of claim 7, wherein the color is a fluorescent enhanced color.

9. The method of claim 1, wherein the sensor is a color sensor.

10. The method of claim 9, wherein the color sensor includes an optical lens.

11. The method of claim 1, wherein scanning a section of the component carrier tape with a sensor comprises:
    emitting a light on to the component carrier tape; and
    measuring a reflection of the light.

12. A method of retrofitting a pick-and-place machine with a splice detection system, the method comprising:
    attaching a splice detection sensor to the pick-and-place machine in a position fixed above or below a component carrier tape path;
    linking the sensor to a controller; and
    configuring the controller to respond to a signal transmitted by the sensor in response to detecting a splice connection;
    wherein responsive to the transmitted signal, the controller identifies a location corresponding to a feeder slot associated with the sensor.

13. The method of claim 12, wherein the sensor is a color sensor and includes an optical lens.

14. The method of claim 12, wherein the sensor is a vision camera connected to a processor, the processor programmed to detect a color associated with the splice connection.

15. The method of claim 14, wherein the color is a fluorescent enhanced color.

16. The method of claim 14, wherein the processor is programmed to identify the feeder slot in which the splice connection is detected.

17. The method of claim 14, wherein the processor is a central processor unit of the controller and includes executable instructions to effect the detection of the splice connection and the transmission of the signal, and wherein the response of the controller to the signal transmitted by the sensor includes alerting an operator.

18. The method of claim 12, further comprising:
    associating the sensor with a corresponding feeder slot.

19. The method of claim 18, wherein the association is one-to-one.

20. The method of claim 12, wherein the location is a feeder slot number.

21. The method of claim 20, wherein the signal includes an identifier associated with the feeder slot number.

22. A pick-and-place machine comprising:
    a pickup head moveable to pick electrical components from component carrier tapes extending from feeders mounted in respective feeder slots of the machine;
    component tape splice sensors attached to the machine and fixed above or below respective tape paths, the sensors each adapted to scan component carrier tape in their respective paths and to generate a splice detection signal in response to detecting a splice connection; and
    a controller linked to the sensors and configured to receive the splice detection signals and to identify, in response to receiving a splice detection signal, a respective feeder slot associated with the detected splice connection.

23. The machine of claim 22, wherein the sensors comprise a vision camera connected to a processor programmed to detect a color associated with the splice connection.

24. The machine of claim 23, wherein the processor is programmed to determine the feeder slot in which the splice connection is detected.

25. The machine of claim 23, wherein the processor is a central processor unit of the controller and includes executable instructions to effect the detection of the splice connection and the transmission of the splice detection signal.

26. The machine of claim 25, wherein the splice detection signal is a software encoded flag.

27. The machine of claim 25, wherein the splice detection signal is a bit setting in a memory register of the processor.

28. The machine of claim 22 wherein the sensors comprise a vision camera connected to a processor of the controller, the processor coupled to a memory storing instructions executable by the processor to detect a color associated with the splice connection and to determine the feeder slot in which the splice connection is detected.

29. The machine of claim 28, wherein the splice detection signal is a software encoded flag.

30. The machine of claim 28, wherein the splice detection signal is a bit setting in a memory register of the processor.

31. The machine of claim 30, wherein the link is an internal data bus of the processor.

32. The machine of claim 22, wherein the sensors are color sensors.

33. The machine of claim 32, wherein the color sensors include an optical lens.

34. The machine of claim 32, wherein the sensors are adapted to measure a reflection of a light emitted on to the component carrier tape.

35. The machine of claim 22, wherein the sensors are associated with corresponding feeder slots.

36. The machine of claim 35, wherein the association is one-to-one.

37. The machine of claim 35, wherein the splice detection signal includes an identifier associated with the feeder slot in which the splice connection is detected.

38. The machine of claim 37, wherein the identifier is a feeder slot number.

* * * * *